United States Patent

Takada et al.

Patent Number: 5,382,787
Date of Patent: Jan. 17, 1995

[54] PHOTOCONDUCTIVE MATERIAL

[75] Inventors: Jun Takada; Akihiko Nakajima; Yoshihisa Tawada, all of Hyogo, Japan

[73] Assignee: Kanegafuchi Chemical Industry Co., Ltd., Osaka, Japan

[21] Appl. No.: 909,901

[22] Filed: Jul. 7, 1992

[30] Foreign Application Priority Data

Jul. 9, 1991 [JP] Japan ................................. 3-195960
Feb. 18, 1992 [JP] Japan ................................. 4-081347

[51] Int. Cl.$^6$ ............................................. H01J 40/14
[52] U.S. Cl. ................................ 250/214.1; 429/111
[58] Field of Search ....................... 250/214.1, 551; 429/111

[56] References Cited

U.S. PATENT DOCUMENTS

| | | | |
|---|---|---|---|
| 4,400,451 | 8/1983 | Gordon | 429/111 |
| 4,419,278 | 12/1983 | Gordon | 429/111 |
| 4,927,721 | 5/1990 | Gratzel et al. | 429/111 |
| 4,939,308 | 7/1990 | Maxfield et al. | 505/1 |

FOREIGN PATENT DOCUMENTS 62-034981  2/1987  Japan .

OTHER PUBLICATIONS

Ferroelectrics, vol. 43, 1982, New York, US, pp. 195–198, A. L. Kholkin et al. "Transient Photocurrents and Photoconductivity in Strontium Titanate".
Journal of the Physical Society of Japan, Proceedings of the Second International Meeting on Ferroelectricity 1969, vol. 28, 1970, Tokyo JP, pp. 454–456, H. Yasunaga "Photoconductivity Anomaly as an Evidence of the Local Ferroelectric Phase Transition around 47° K in SrTiO3".
Physical Review, vol. 129, No. 1, 1 Jan. 1963, New York, US, pp. 90–94, R. O. Bell et al "Elastic Constants of Strontium Titanate".
Journal of the Physical Society of Japan, vol. 31, 1971, Tokyo JP, p. 614, K. Ohi et al., "Photoconduction of Potassium Tantalate".

*Primary Examiner*—David C. Nelms
*Attorney, Agent, or Firm*—Jordan and Hamburg

[57] ABSTRACT

The invention provides a temperature switch material capable of detecting a very low temperature not higher than 150 K. It also provides a light switch material for detecting light in the ultraviolet region. It further provides a switch material suited for use as a substrate for thin oxide layer formation thereon. The switching material utilizes an abrupt change in photoelectric current as produced upon phase transition of $SrTiO_3$ at a low temperature. The photoelectric switch or temperature switch utilizes the change in photoconduction spectrum upon irradiation of $SrTiO_3$ with light in the 3 eV–5 eV ultraviolet region. A switch is available by varying the intensity of irradiating light thereby controlling the transition temperature.

4 Claims, 4 Drawing Sheets

PHOTOCONDUCTIVE MATERIAL

BACKGROUND OF THE INVENTION

The present invention relates to a photoconductive material. More particularly, it relates to a photoconductive material showing changes in electrical conductivity upon changes in temperature. The invention further relates to a switching material, which is one of the photoconductive materials. In particular the present invention relates to a novel switching material which can be used as a material for the manufacture of photoelectric switches capable of sensing light in the ultraviolet region or temperature switches capable of sensing very low temperatures not higher than 150 K.

Photoconductive materials that show an increased electrical conductivity upon light irradiation and thus facilitate electric current flow are used in light sensors, camera tube photoelectric surfaces, electronic drums and the like. Typical examples of such materials are semiconductors made of silicon, germanium or the like.

However, none of these known photoconductive materials has been found to be a material capable of markedly changing its photoconductivity upon temperature changes.

Therefore, in the case of temperature switches manufactured by using the conventional photoconductive materials, the signal/noise (S/N) ratio on the occasion of switching on or off is not very great since the change in photoelectric current is small. When temperature switches comprising a photoconductive material having such characteristics are used in electric circuit elements, operating errors may possibly be caused by external noises.

Photoconductivity is a characteristic observed with a very large number of materials, for example, nonmetal solid-form simple substances, and sulfides. Various switching materials in which such photoconductivity characteristics is utilized have been provided.

However, these prior art switching materials cannot serve in the ultraviolet region since they rely on their spectral characteristics in connection with visible or infrared light. The lowest temperature limit at which they still can serve is as high as about −30° C. None of the prior art switching materials is known to be usable at such very low temperatures as 150 K. or below.

On the other hand, for semiconductors such as silicon or germanium, the temperature function of the electrical conductivity changes merely exponentially, without showing any abrupt conductivity change at a certain specific temperature. It is out of the question to apply such semiconductors to temperature switches for sensing such an extremely low temperature as 150 K.

In the case of composite materials made by depositing an oxide conductive thin film layer on a substrate made of silicon or the like known photoelectric material at an elevated temperature (e.g. 500° C.), an insulator material is formed in the interface between the substrate and thin film, hence electric connection between the substrate and thin film is impossible.

SUMMARY OF THE INVENTION

The present inventors made intensive investigations concerning the problems of such prior art photoconductive materials and found that a photoconductive material comprising a certain kind of substance capable of changing its phase structure shows marked changes in photoconductivity upon changes in temperature. This finding has now led to completion of the present invention.

The inventors also found that $SrTiO_3$, a substance already studied from the structural phase transition viewpoint [cf. e.g. R. O. Bell and G. Rupprecht, Phys. Rev., 129, 90 (1963)] but given little attention as a photoelectric material because of its being electrically an insulator, can be applied as a switching material.

A. L. Kholkin et al., Ferroelectrics, Vol. 43, p. 195 (1982), ∓Transient Photocurrents and Photoconductivity in Strontium Titanate" shows experiments for the photoconductivity of pure $SrTiO_3$ at about 110 K., where mobility is reported increasing. However, this reference does not provide teachings of the present invention, particularly those shown in FIGS. 2–4.

The invention thus provides the following:

A photoconductive material which comprises a substance with the perovskite structure, whose crystal structure can undergo phase transition, said substance being irradiated with a light beam having an energy in the range of 3 eV to 5 eV at a temperature lower than 150 K.

These photoconductive materials show great photoconductivity changes upon temperature changes and, therefore, when used in temperature switches can give relatively high signal/noise ratios. These materials can also be used advantageously for other purposes.

As the substance having the perovskite structure, which is to be used in accordance with the invention, there may be mentioned, among others, $SrTiO_3$, $BaTiO_3$, $LaAlO_3$, $LaGaO_3$, $PrAlO_3$, $KTaO_3$, $KNbO_3$ and $NaNbO_3$. Among these, those that are paraelectric, such as $SrTiO_3$ and $KTaO_3$, are preferred to those that are ferroelectric from the high carrier mobility viewpoint.

The invention thus further provides the following:

A photoconductive material making use of the change of the photoelectric characteristics due to the phase transition, which material comprises $SrTiO_3$ irradiated with a light beam having an energy in the range of 3 eV to 5 eV at a temperature lower than 150 K.;

A photoconductive material where the light beam having an energy in the range of 3 eV to 5 eV, which is to be used for irradiation, is varied in intensity; and A switching material in which a photoconductive material is used.

In the switching materials mentioned above, the photoconductivity of $SrTiO_3$ changes greatly at a temperature at which its phase transition takes place. Therefore, they are used as switches for sensing or detecting said temperature. Their photoconduction spectrum in the ultraviolet region of 3 to 5 eV varies in a temperature-dependent manner and, therefore, they can be used, for example, in light-receiving portions of light switches and the like, which are to receive light having certain spectral characteristics in the ultra-violet region. Furthermore, when the temperature is constant, the photoelectric current value varies corresponding to the intensity of light irradiation. Therefore, they can further be used as switching materials for light switches. In that case, the light intensity can also be measured concomitantly.

DETAILED DESCRIPTION OF PREFERRED EMBODIMENTS

In the following, some embodiments of the present invention are illustrated with reference to the drawings.

SrTiO$_3$, one of the photoelectric materials according to the invention, a paraelectric substance having the perovskite structure and capable of undergoing structural phase transition from the cubic to the tetragonal system. This substance occurs as a tetragonal crystal at temperatures as low as about 105 K. and below and as a cubic crystal at higher temperatures.

Some experiments made with this substance are described below by way of example.

The specimens used were prepared by excising pieces having a width of 2.5 mm, a thickness of 0.5 mm and a length of 10 mm from an SrTiO$_3$ single crystal (produced by the Bernoulli method by Earth Jewelry) so that its (100) face appeared on the surface, then mirror-finished on one side alone, and it was fitted with copper wires, as electrodes, at a distance of 1.5 mm, using a silver paste.

From the characteristics viewpoint, the oxygen deficiency concentration in SrTiO$_3$ in the above case should preferably be not higher than 10 atomic percent.

These specimens were placed on a copper stand in a refrigerator and the refrigerator was evacuated to 10 mTorr using a rotary pump. Then, the specimens were subjected to spectrophotometry using a 500 W xenon lamp and a monochromator. While irradiating the specimens with a light beam having an excitation energy of 3.35 eV through a sapphire window, their temperature was decreased. In that process, the specimen temperature was monitored using a thermocouple fixed thereto with a silver paste.

Figure 1:
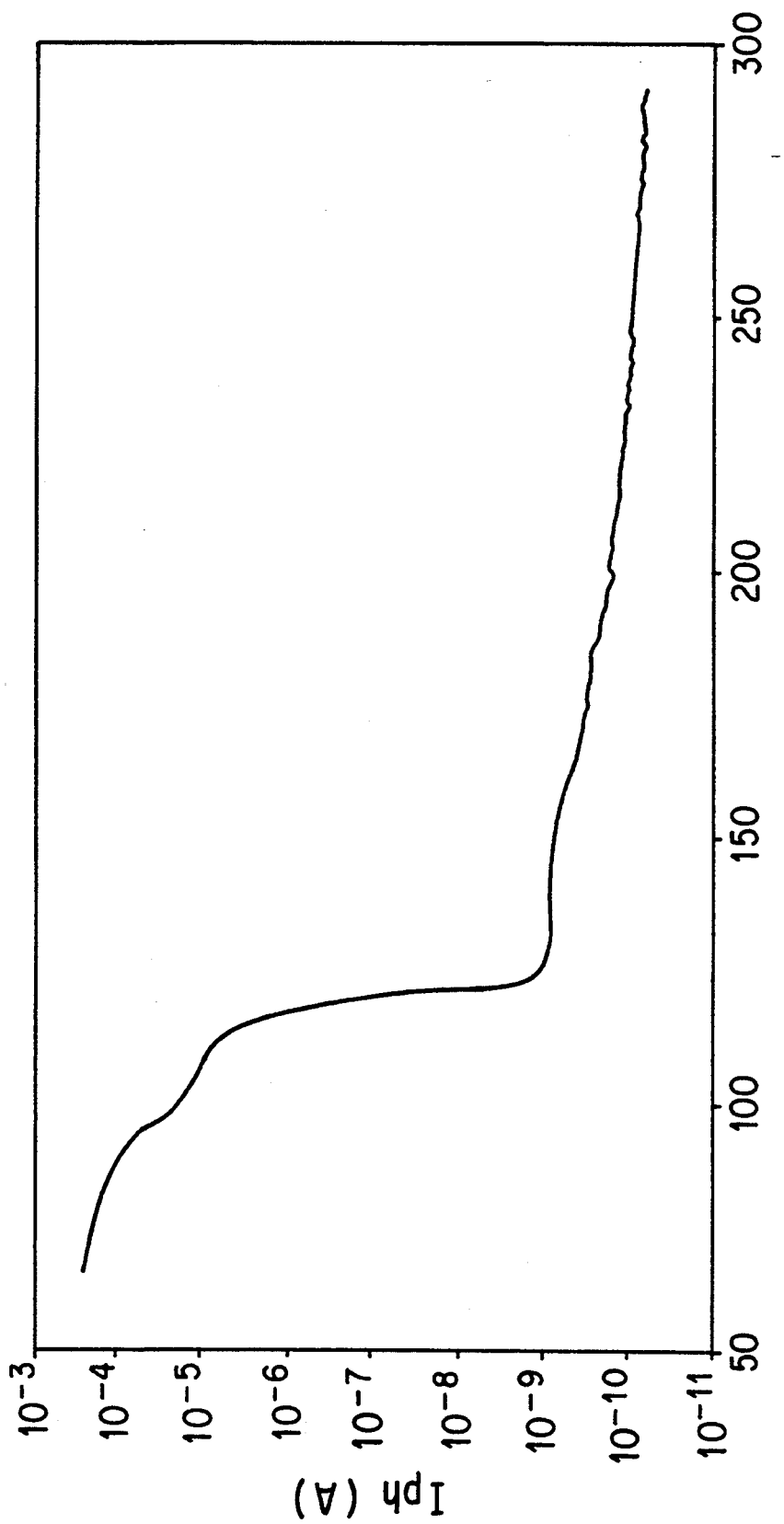
FIG. 1 graphically illustrates, for $SrTiO_3$, the relation between photoelectric current and temperature.

FIG. 1 shows the temperature dependency of the photoelectric current $I_{Ph}$ against the 3.35 eV excitation light. According to the figure, the photoconduction increases abruptly in an exponential manner toward the lower temperature side at about 100 to 120 K. It is known that 105 K. is the structural phase transition temperature for SrTiO$_3$ and this occurs as a cubic crystal at temperatures above said temperature and as a tetragonal crystal at temperatures below that temperature.

Measurement of the characteristic shown in FIG. 1 by gradually lowering the temperature and measurement of the same by gradually raising the temperature gave the same and identical curve, hence no hysteresis was observed.

If such abrupt increase in $I_{Ph}$ at around the cubic-to-tetragonal structural phase transition temperature for SrTiO$_3$ is involved in said transition, it is presumable that the state density might vary structurally on that occasion.

Then, how the characteristic shown in FIG. 1 changes depending on the intensity of irradiating light was examined. The measurement results obtained are shown in FIG. 2.

Figure 2:
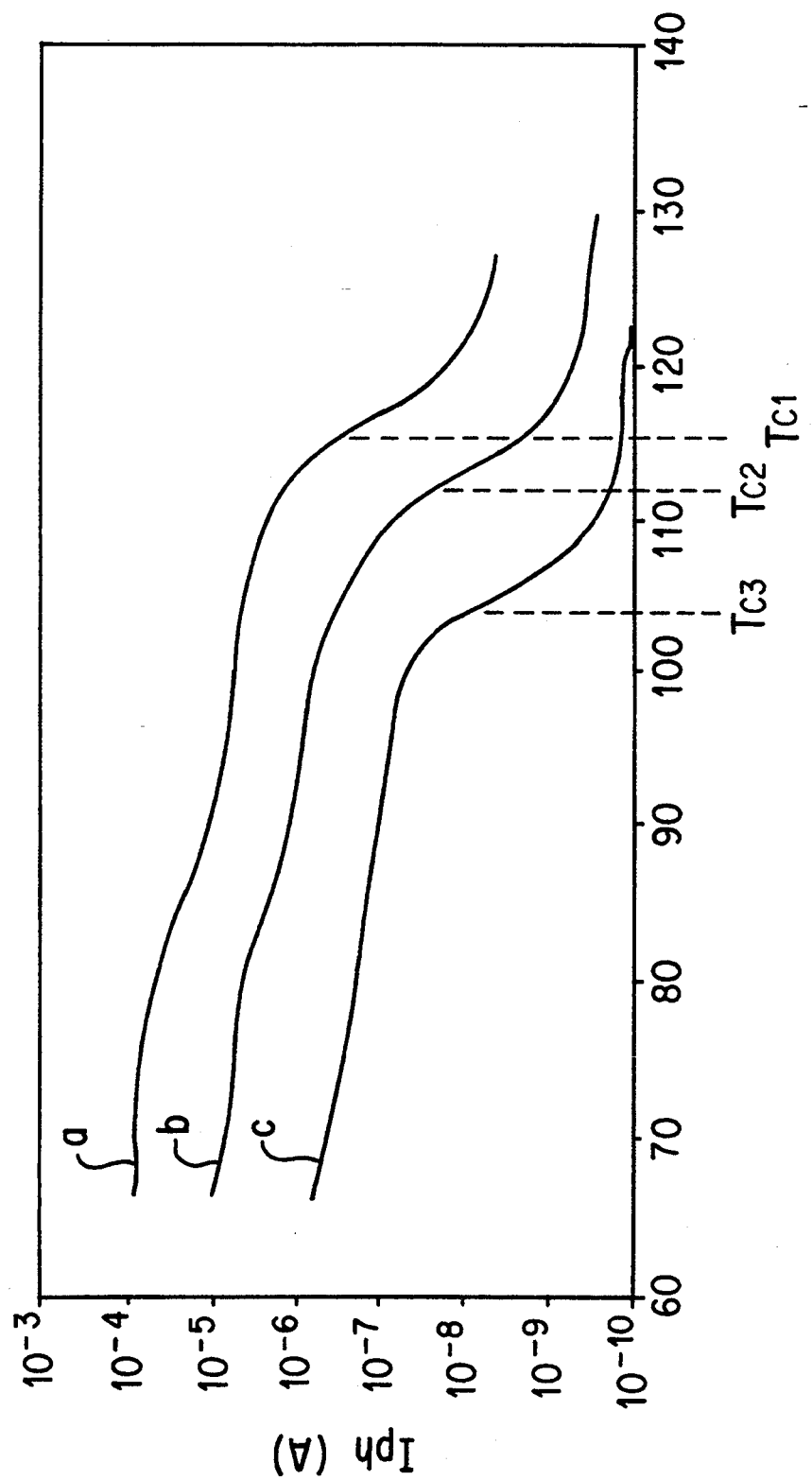
FIG. 2 graphically illustrates, for SrTiO$_3$, changes in photoconduction spectrum corresponding to temperature changes.

In FIG. 2, the curves a, b and c correspond to the relative irradiation light intensities of 1.0, 0.1 and 0.01, respectively. If the temperature which gives 10% of the photoelectric current just after transition along the $I_{Ph}(T)$ curve is defined as $T_{c1}$, $T_{c2}$ or $T_{c3}$, said temperature is 115 K., 111 K. or 104 K., respectively, as shown by the figure. Note that the increase of Tc is not a thermal effect. Although increasing light intensity might increase the sample temperature, this could lead to an estimation of Tc lower than the value in the dark. Thus, it can be expected that when the light intensity is increased, the transition temperature will rise gradually according to the increase in light intensity. It is presumable that the possible formation of electron-hole pairs, as resulting from absorption of photons, may exert an influence on the phase transition of SrTiO$_3$.

Further, changes in photoconduction spectrum were measured by varying the temperature. The measurement results obtained are shown in FIG. 3.

Figure 3:
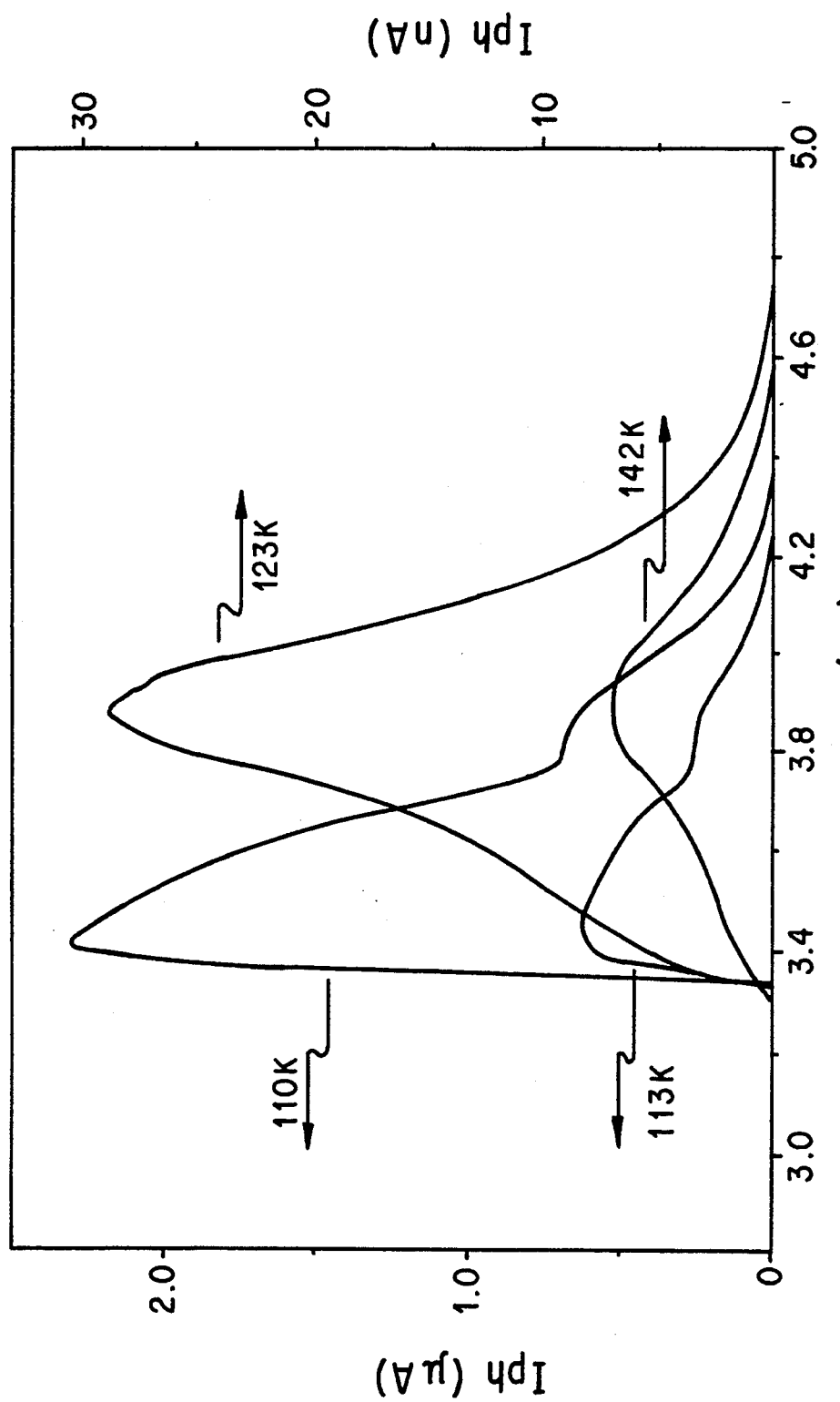
FIG. 3 graphically illustrates, for SrTiO$_3$, the relation between photoelectric current and irradiating light intensity as influenced by temperature.

In FIG. 3, the measurement results in the 3–5 eV ultraviolet region at temperatures of 110 K., 113 K., 123 K. and 142 K. For the former two temperatures, the measured values should be read on the left axis in FIG. 3 (i.e. in $\mu$A) while the measured values for the latter two temperatures on the right axis (in nA).

The measurement results shown in FIGS. 1 to 3 indicate that when SrTiO$_3$ is irradiated with light having an energy within the range of 3 to 5 eV at temperatures not higher than 150 K., its conductivity changes abruptly and that when the temperature is given, SrTiO$_3$ gives a photoconduction spectrum characteristic of that temperature. Such changes in photoconduction spectrum at 150 K. and below can be considered to be associated with the cubic-to-tetragonal structural phase transition of SrTiO$_3$. Thus, a switching element showing two photoconduction spectra can be manufactured from one SrTiO$_3$ material since its photoconduction spectrum in cubic state differs significantly from that in tetragonal state.

Based on the characteristic shown in FIG. 1, namely the great change in photoconductivity around the temperature $T_c$ at which SrTiO$_3$ undergoes phase transition, the material of the invention can be used as a switching material for temperature switches sensing said temperature.

Based on the characteristic shown in FIG. 2, i.e. the property that the above-mentioned temperature $T_c$ varies to $T_{c1}$, $T_{c2}$, $T_{c3}$, etc. according to the intensity of irradiating light, the SrTiO$_3$ material can serve as a temperature switch for different sensing temperatures by varying the irradiating light intensity. It can further be used as a light switch, since, when SrTiO$_3$ is maintained at a temperature slightly higher than $T_{c3}$, for instance, is subjected to light irradiation, it shifts to a state higher in conductivity (e.g. state a or b graphically shown in FIG. 2). Based on the characteristic shown in FIG. 2, it is further possible to measure the intensity of light by measuring the photoelectric current since, at a given or constant temperature, the photoelectric current value changes corresponding to the intensity of irradiating light.

Based on the characteristic shown in FIG. 3, i.e. the fact that a change in temperature results in a change in the photoconduction spectrum in the 3–5 eV ultraviolet region and that a given temperature corresponds to a photoconduction spectrum specific thereto, said material can be used in light-receiving portions of light switches and the like showing different light-receiving characteristics upon changes in temperature.

Figure 4:
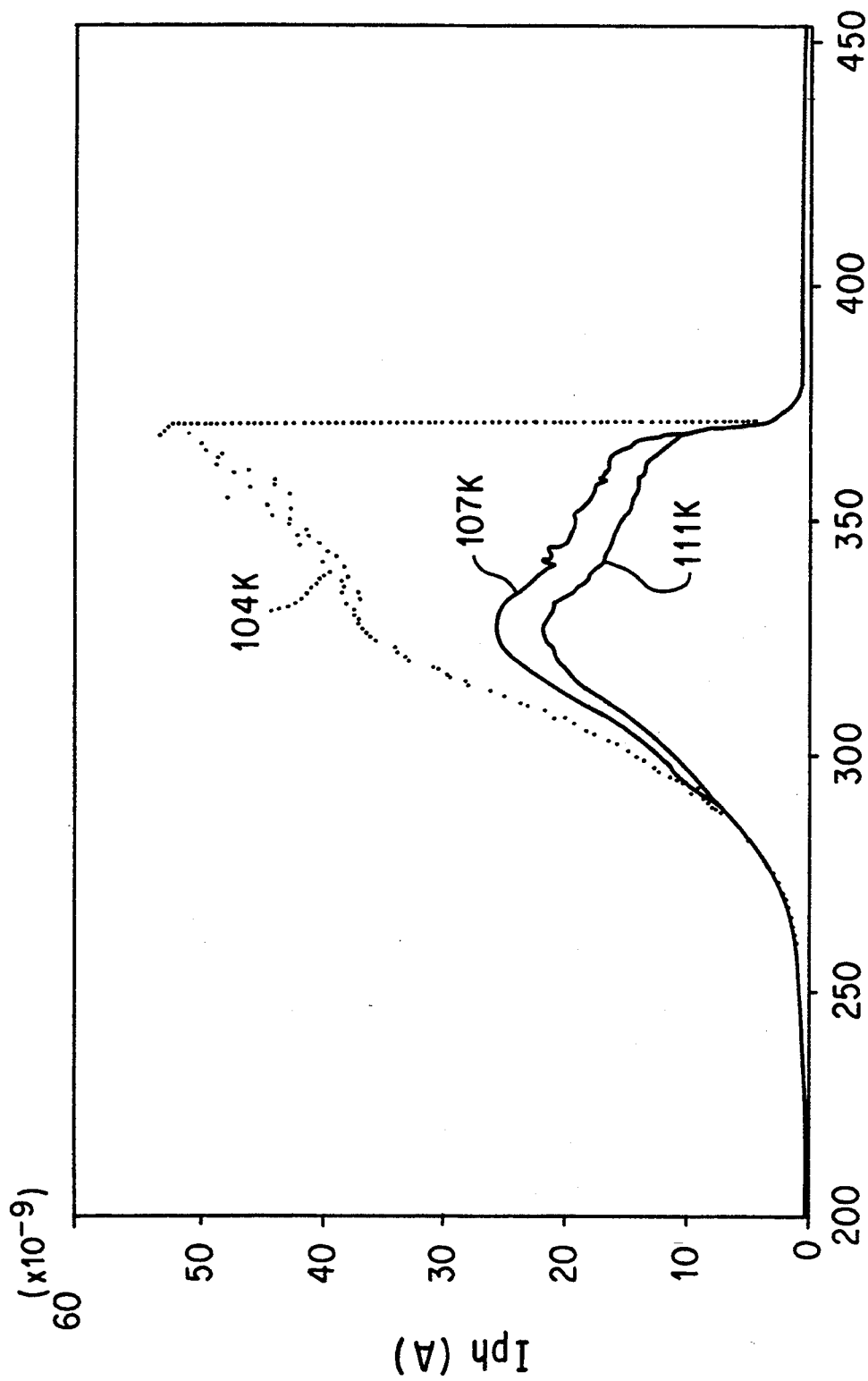
FIG. 4 graphically illustrates, for SrTiO$_3$, the relation between photoelectric current and wavelength.

Further, the relation between photoelectric current and wavelength as possibly influenced by the change in temperature was investigated. The results obtained are shown in FIG. 4. From FIG. 4, it is apparent that the photoelectric current increases at a temperature of about 105 K as a boundary and that this increase is accompanied by shifting the peak of the spectrum to the longer wavelength side. The reason for this increase in photoelectric current and shift of the spectrum is not quite clear but it is presumable that, since 105 K. is the cubic-to-tetragonal structural phase transition temperature for $SrTiO_3$, said fact might well be associated with the structural phase transition, from cubic to tetragonal, of $SrTiO_3$.

In the embodiments mentioned hereinabove, the crystal structure phase transition is controlled by changing the temperature. However, the phase transition can also be attained by changing the pressure, hence the crystal structure phase transition can be controlled by means of pressure as well.

As described hereinabove, since the photoconductivity of $SrTiO_3$ material according to the invention changes markedly at the structural phase transition temperature thereof as a boundary, it can be used as a temperature switch for detecting or sensing the temperature. Since this transition temperature changes depending on the intensity of irradiating light, it can be utilized as a temperature switch capable of sensing different temperatures when the intensity of irradiating light is varied. Since the photoconduction spectrum for light in the 3-5 eV ultraviolet region varies depending on the temperature, said material can further be used, for example, in light-receiving portions of light switches and the like which receive light showing a certain specific spectral characteristic in the ultraviolet region, at a certain constant temperature. Furthermore, when switching elements are manufactured by deposition on $SrTiO_3$ substrates, epitaxial growth is possible and high melting points can be obtained, so that said material can be used as a substrate for thin oxide layer formation thereon in the manufacture of switching elements.

We claim:

1. A photoconductive method comprising irradiating a substance having a perovskite structure, whose crystal structure can undergo phase transition, with a light beam having an energy in a range of 3eV to 5eV; and varying a light intensity of the light beam at an ambient temperature in a range lower than 150 K. and around a structural phase transition temperature of said substance, thereby varying a structural phase transition temperature of said substance and changing photoconductivity of said substance.

2. A photoconductive method according to claim 1, wherein said substance is $SrTiO_3$.

3. A photoconductive method comprising changing an ambient temperature of a substance having a perovskite structure, whose crystal structure can undergo phase transition, in a range lower than 150 K. and around a structural phase transition temperature of said substance, thereby changing a photoconduction spectrum, representing a light receiving characteristic, of said substance.

4. A photoconductive method according to claim 1, wherein said substance is $SrTiO_3$.

* * * * *